United States Patent [19]
Miyamoto et al.

[11] Patent Number: 6,154,029
[45] Date of Patent: Nov. 28, 2000

[54] MR IMAGING METHOD AND APPARATUS

[75] Inventors: Shoei Miyamoto; Susumu Kosugi, both of Tokyo, Japan

[73] Assignee: GE Yokogawa Medical Systems, Limited, Tokyo, Japan

[21] Appl. No.: 09/286,642

[22] Filed: Apr. 2, 1999

[30] Foreign Application Priority Data

Aug. 5, 1998 [JP] Japan .................................. 10-126432

[51] Int. Cl.[7] ...................................................... G01V 3/00
[52] U.S. Cl. ........................... 324/312; 324/307; 324/300
[58] Field of Search .................................... 324/312, 309, 324/300, 307

[56] References Cited

U.S. PATENT DOCUMENTS

| | | | |
|---|---|---|---|
| 5,119,026 | 6/1992 | Iino et al. | 324/309 |
| 5,270,654 | 12/1993 | Feinberg et al. | 324/309 |
| 5,545,990 | 8/1996 | Feinberg et al. | 324/307 |

FOREIGN PATENT DOCUMENTS

| | | |
|---|---|---|
| 19511919 | 11/1995 | Germany. |
| 8038452 | 2/1996 | Japan. |

*Primary Examiner*—Jay Patidar
*Assistant Examiner*—Brij B. Shrivastav
*Attorney, Agent, or Firm*—Mooray Kojima

[57] ABSTRACT

In order to reduce ghosts due to increasing echo intensity fall-off in the course of an echo train in MR imaging employing the FSE method, the present method assigns individual echoes in the echo train to respective segments to acquire data F(S1–S3), then assigns individual echoes arranged in the reverse order to the respective segments so that the order of signal intensity magnitude in the data F is inverted, to acquire data R(S4–S5), adds the data F and R for each view, and produces an image from the sum data. The number of echoes in the echo train is preferably selected to be an even number.

8 Claims, 12 Drawing Sheets

MR IMAGING METHOD AND APPARATUS

BACKGROUND OF THE INVENTION

The present invention relates to an MR (magnetic resonance) imaging method and apparatus capable of reducing ghosts due to increasing echo signal intensity fall-off in the course of an echo train and/or due to phase errors.

The FSE (fast spin echo) method is a data acquisition method which applies m($\geq 2$) inversion pulses per excitation pulse to generate first to $m^{th}$ echoes, acquire data for m views in a k-space from the echoes, and repeats these steps M/m times, where M is the total number of views in the k-space (the total number of data sets in the phase axis direction), to acquire data for all views in the k-space.

This method can be conducted by a sequential process or a centric process depending on the way of determining which view data is acquired by which echo.

The sequential process divides a k-space into first to $m^{th}$ segments in the phase axis direction, assigns first to $m^{th}$ echoes serially to the first to $m^{th}$ segments, and acquires data for a certain view from an echo assigned to a segment to which the data belongs.

The centric process divides all views in a k-space into first to $2m^{th}$ segments in the phase axis direction, assigns first to $m^{th}$ echoes serially to the first to $m^{th}$ segments and $m^{th}$ to first echoes serially to the $(m+1)^{th}$ to $2m^{th}$ segments, and, when a time period up to an $\alpha^{th}$ echo is an effective TE, cyclically shifts the individual segments so that the segment center of the $\alpha^{th}$ echo is placed in the k-space center, and acquires data for a certain view from an echo assigned to a segment to which the data belongs.

Other data acquisition methods include the SSFSE (single shot fast spin echo) method which applies M inversion pulses per excitation pulse to generate first to $M^{th}$ echoes and acquires data for all views in a k-space from the echoes.

FIG. 1 is a schematic diagram illustrating the signal intensity distribution of data acquired while applying phase encode based on the echo-to-view assignment in a k-space according to the sequential process.

FIG. 2 is a schematic diagram illustrating the signal intensity distribution of data acquired while applying phase encode based on the echo-to-view assignment in a k-space according to the centric process.

As shown in FIGS. 1 and 2, there are stepwise differences in signal intensity among the segments. This is caused by increasing echo intensity fall-off in the course of an echo train. This leads to the problem of the appearance of ghosts in the image.

FIG. 3 is a schematic diagram illustrating the phase error in each echo in an echo train according to the FSE or SSFSE method.

The generated phase errors have opposite directions (signs) at odd-indexed echoes and even-indexed echoes. This also leads to the problem of the appearance of ghosts in the image.

SUMMARY OF THE INVENTION

It is an object of the present invention to provide an MR imaging method and apparatus capable of reducing ghosts due to increasing echo intensity fall-off in the course of an echo train.

It is another object of the present invention to provide an MR imaging method and apparatus capable of reducing ghosts due to phase errors.

In accordance with a first aspect of the present invention, there is provided an MR imaging method for repeatedly generating first to m ($\geq 2$)$^{th}$ echoes per RF pulse and acquiring data for m views in a k-space from the echoes to acquire data for all views in the k-space, wherein the method comprises the steps of: dividing the k-space into first to $m^{th}$ segments in a phase axis direction, assigning first to $m^{th}$ echoes serially to the first to $m^{th}$ segments, and acquiring data F while applying phase encode based on the assignment; assigning $m^{th}$ to first echoes serially to the first to $m^{th}$ segments, and acquiring data R while applying phase encode based on the assignment; and adding the data F and R for each view, and producing an image based on the sum data.

In the MR imaging method as described regarding the first aspect, the order of the echoes assigned to the segments in acquiring the data R is the reverse of the order of the echoes assigned to the segments in acquiring the data F. That is, the order of the signal intensity magnitude for the data R is inverted with respect to that for the data F so that the segment where the signal intensity for the data F is the largest has the smallest signal intensity for the data R. Therefore, by adding the data F and R for each view, the signal intensities are averaged and the stepwise differences in signal intensity are reduced. Accordingly, ghosts can be reduced by reducing an image using the sum data.

If an even number is selected for m, the addition of the data F and R is equivalent to addition of an odd-indexed echo and an even-indexed echo. Since phase errors in odd-indexed echoes and even-indexed echoes have opposite directions (signs), the phase errors cancel each other and are reduced. Accordingly, ghosts can be reduced also in this respect.

In accordance with a second aspect of the present invention, there is provided an MR imaging method for repeatedly generating first to m($\geq 2$)$^{th}$ echoes per RF pulse and acquiring data for m views in a k-space from the echoes to acquire data for all views in the k-space, wherein the method comprises the steps of: dividing the k-space into first to $2m^{th}$ segments in a phase axis direction, assigning first to $m^{th}$ echoes serially to the first to $m^{th}$ segments and $m^{th}$ to first echoes serially to the $(m+1)^{th}$ to $2m^{th}$ segments, and acquiring data F while applying phase encode based on the assignment; assigning $m^{th}$ to first echoes serially to the first to $m^{th}$ segments and first to $m^{th}$ echoes serially to the $(m+1)^{th}$ to $2m^{th}$ segments, and acquiring data R while applying phase encode based on the assignment; and adding the data F and R for each view, and producing an image based on the sum data.

In the MR imaging method as described regarding the second aspect, the order of echoes assigned to the segments in acquiring the data R is the reverse of the order of echoes assigned to the segments in acquiring the data F. That is, the order of the signal intensity magnitude for the data R is inverted with respect to that for the data F so that the view where the signal intensity for the data F is the largest has the smallest signal intensity for the data R. Therefore, by adding the data F and R for each view, the signal intensities are averaged and the stepwise differences in signal intensity are reduced. Accordingly, ghosts can be reduced by producing an image from the sum data.

If an even number is selected for m, the addition of the data F and R is equivalent to addition of an odd-indexed echo and an even-indexed echo. Since phase errors in odd-indexed echoes and even-indexed echoes have opposite directions (signs), the phase errors cancel each other and are reduced. Accordingly, ghosts can be reduced also in this respect.

In accordance with a third aspect of the present invention, there is provided an MR imaging method for generating multiple echoes per RF pulse and acquiring data for all views in a k-space, wherein the method comprises the steps of: generating first to $M^{th}$ echoes per RF pulse, wherein M is the total number of views in the k-space, and acquiring data F for all views in the k-space; generating first to $(M+1)^{th}$ echoes per RF pulse, and acquiring data R for all views in the k-space from the second to $(M+1)^{th}$ echoes thereof; and adding the data F and R for each view, and producing an image based on the sum data.

In the MR imaging method as described regarding the third aspect, the echoes assigned to the views in acquiring the data R are shifted by one with respect to the echoes assigned to the views in acquiring the data F. Therefore, in acquiring the data R, an even-indexed echo is assigned to a view to which an odd-indexed echo was assigned in acquiring the data F, and an odd-indexed echo is assigned to a view to which an even-indexed echo was assigned in acquiring the data F. Phase errors in odd-indexed echoes and even-indexed echoes have opposite directions (signs). Therefore, by adding the data F and R for each view, the phase errors cancel each other and are reduced. Accordingly, ghosts can be reduced by producing an image from the sum data.

In accordance with a fourth aspect of the present invention, there is provided an MR imaging method for generating a plurality of echoes per RF pulse and acquiring data for a plurality of views in a k-space, wherein the method comprises the steps of: assigning an odd-indexed echo to an odd-indexed view and an even-indexed echo to an even-indexed view, and acquiring data F while applying phase encode based on the assignment; assigning an even-indexed echo to an odd-indexed view and a an odd-indexed echo to an even-indexed view, and acquiring data R while applying phase encode based on the assignment; and adding the data F and R for each view, and producing an image based on the sum data.

In the MR imaging method as described regarding the fourth aspect, an odd-indexed echo and an even-indexed echo are permuted in the echo train assigned to the views in acquiring the data F and in the echo train assigned to the views in acquiring the data R. That is, in acquiring the data R, an even-indexed echo is assigned to a view to which an odd-indexed echo was assigned in acquiring the data F, and an odd-indexed echo is assigned to a view to which an even-indexed echo was assigned in acquiring the data F. Phase errors in odd-indexed echoes and even-indexed echoes have opposite directions (signs). Therefore, by adding the data F and R for each view, the phase errors cancel each other and are reduced. Accordingly, ghosts can be reduced by producing an image from the sum data.

In accordance with a fifth aspect of the present invention, there is provided an MR imaging apparatus comprising: first assigning means for dividing a k-space into first to $m^{th}$ segments in a phase axis direction, and assigning first to $m^{th}$ echoes serially to the first to $m^{th}$ segments; second assigning means for assigning $m^{th}$ to first echoes serially to the first to $m^{th}$ segments; data acquisition means for repeatedly generating first to $m(\geq 2)^{th}$ echoes per RF pulse and acquiring data for m views in the k-space from the echoes to acquire data for all views in the k-space, the data acquisition means acquiring data F while applying phase encode based on the assignment by the first assigning means, and acquiring data R while applying phase encode based on the assignment by the second assigning means; data addition means for adding the data F and R for each view; and image producing means for producing an image based on the sum data from the addition.

The MR imaging apparatus as described regarding the fifth aspect can suitably implement the MR imaging method in the first aspect.

In accordance with a sixth aspect of the present invention, there is provided an MR imaging apparatus comprising: first assigning means for dividing a k-space into first to $2m^{th}$ segments in a phase axis direction, and assigning first to $m^{th}$ echoes serially to the first to $m^{th}$ segments and $m^{th}$ to first echoes serially to the $(m+1)^{th}$ to $2m^{th}$ segments; second assigning means for assigning $m^{th}$ to first echoes serially to the first to $m^{th}$ segments and first to $m^{th}$ echoes serially to the $(m+1)^{th}$ to $2m^{th}$ segments; data acquisition means for repeatedly generating first to $m(\geq 2)^{th}$ echoes per RF pulse and acquiring data for m views in the k-space from the echoes to acquire data for all views in the k-space, the data acquisition means acquiring data F while applying phase encode based on the assignment by the first assigning means, and acquiring data R while applying phase encode based on the assignment by the second assigning means; data addition means for adding the data F and R for each view; and image producing means for producing an image based on the sum data from the addition.

The MR imaging apparatus as described regarding the sixth aspect can suitably implement the MR imaging method in the second aspect.

In accordance with a seventh aspect of the present invention, there is provided an MR imaging apparatus comprising: first data acquisition means for generating first to $M^{th}$ echoes per RF pulse, where M is the total number of views in a k-space, and acquiring data F for all views in the k-space; second data acquisition means for generating first to $(M+1)^{th}$ echoes per RF pulse, and acquiring data R for all views in the k-space from the second to $(M+1)^{th}$ echoes thereof; data addition means for adding the data F and R for each view; and image producing means for producing an image based on the sum data from the addition.

The MR imaging apparatus as described regarding the seventh aspect can suitably implement the MR imaging method in the third aspect.

In accordance with an eighth aspect of the present invention, there is provided an MR imaging apparatus comprising: data acquisition means for generating a plurality of echoes per RF pulse to acquire data for a plurality of views in a k-space, assigning an odd-indexed echo to an odd-indexed view and an even-indexed echo to an even-indexed view, and acquiring data F while applying phase encode based on the assignment, and assigning an even-indexed echo to an odd-indexed view and an odd-indexed echo to an even-indexed view, and acquiring data R while applying phase encode based on the assignment; data addition means for adding the data F and R for each view; and image producing means for producing an image based on the sum data.

The MR imaging apparatus as described regarding the eighth aspect can suitably implement the MR imaging method in the fourth aspect.

The present invention applies generally to FSE-type sequences such as the FSE, SSFSE and FSEIR methods.

In accordance with the present MR imaging method and apparatus, ghosts due to increasing echo intensity fall-off in the course of an echo train can be reduced. Moreover, ghosts due to phase errors can be reduced.

Further objects and advantages of the present invention will be apparent from the following description of the preferred embodiments of the invention as illustrated in the accompanying drawings.

DETAILED DESCRIPTION OF THE INVENTION

The present invention will now be described in more detail with reference to preferred embodiments shown in the accompanying drawings.

Figure 1:
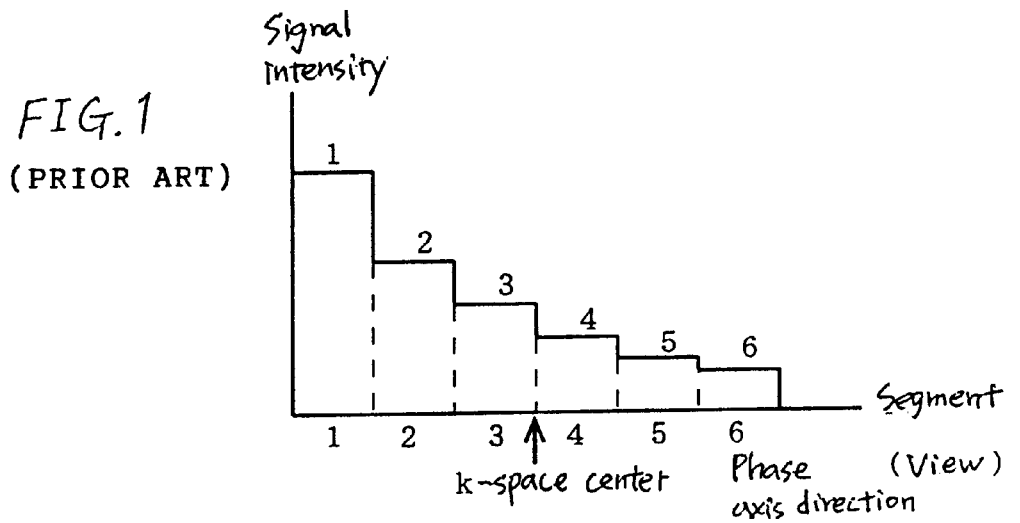
FIG. 1 illustrates the signal intensity in each segment in a conventional MR imaging process according to the FSE method employing the sequential process.
Figure 2:
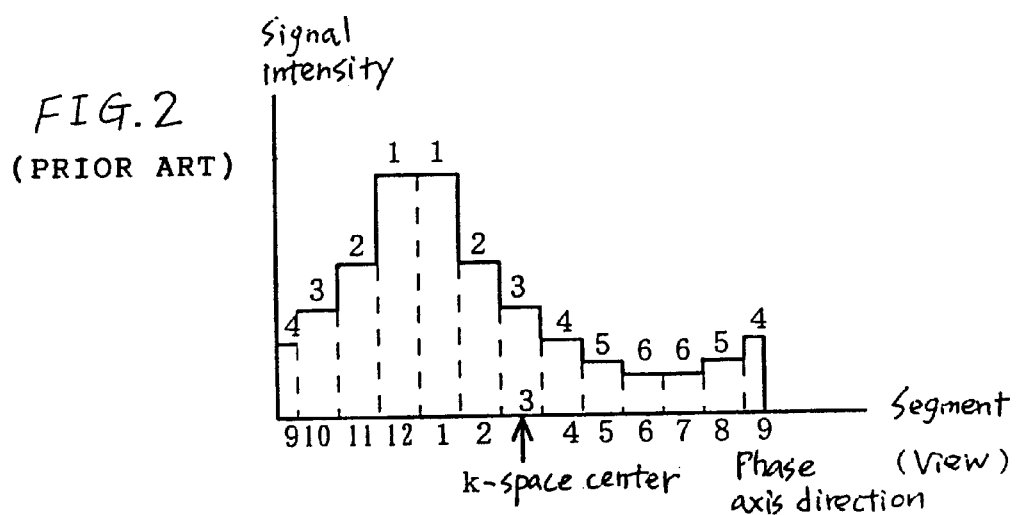
FIG. 2 illustrates the signal intensity in each segment in a conventional MR imaging process according to the FSE method employing the centric process.
Figure 3:
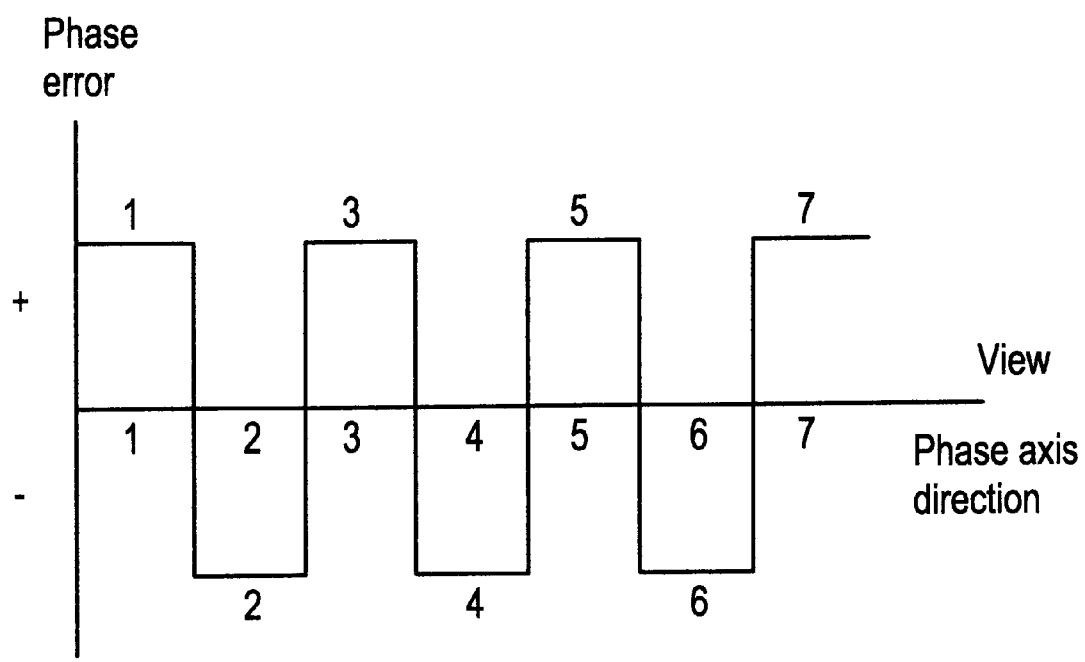
FIG. 3 illustrates the phase error in each view in a conventional MR imaging process according to the SSFSE method.
Figure 4:
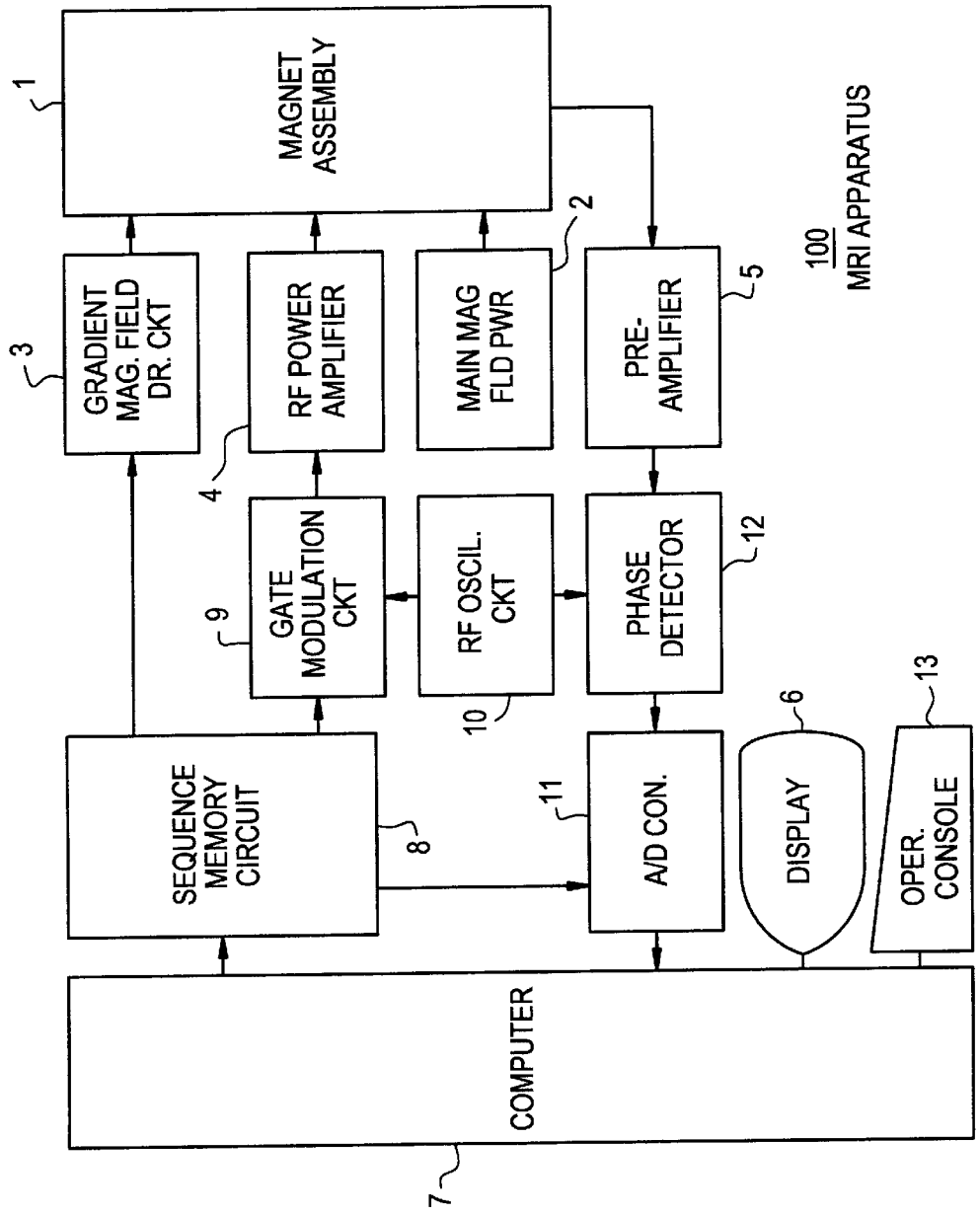
FIG. 4 is a block diagram showing an MR imaging apparatus in accordance with one embodiment of the present invention.

FIG. 4 is a block diagram showing an MR imaging apparatus 100 in accordance with one embodiment of the present invention.

In the MR imaging apparatus 100, a magnet assembly 1 has a space (bore) in which a subject is inserted. Surrounding the space are disposed a main magnetic field coil for applying a constant main magnetic field to the subject, a gradient magnetic field coil for generating gradient magnetic fields (which is comprised of X-axis, Y-axis and Z-axis coils), a transmitter coil for applying an RF pulse for exciting spins in atomic nuclei within the subject, and a receiver coil for detecting an NMR (nuclear magnetic resonance) signal from the subject. The main magnetic field coil, the gradient magnetic field coil, the transmitter coil and the receiver coil are connected to a main magnetic field power supply 2, a gradient magnetic field drive circuit 3, an RF power amplifier 4 and a preamplifier 5, respectively.

In response to a command from a computer 7, a sequence memory circuit 8 operates the gradient magnetic field drive circuit 3 based on a pulse sequence such as in the FSE method to generate gradient magnetic fields from the gradient magnetic field coil in the magnet assembly 1. The sequence memory circuit 8 also operates a gate modulation circuit 9 to modulate a high frequency output signal from an RF oscillation circuit 10 into a pulse-like signal having a predetermined timing and envelope. The pulse-like signal is supplied to the RF power amplifier 4 as an RF pulse and is power amplified in the RF power amplifier 4. The power-amplified signal is then applied to the transmitter coil in the magnet assembly 1 to selectively excite a desired slice region.

The preamplifier 5 amplifies an NMR signal detected from the subject at the receiver coil in the magnet assembly 1 and supplies it to a phase detector 12. The phase detector 12 phase-detects the NMR signal supplied from the preamplifier 5 using an output from the RF oscillation circuit 10 as a reference signal, and supplies the NMR signal to an A/D (analog-to-digital) converter 11. The A/D converter 11 converts the phase-detected analog signal into a digital signal and supplies it to the computer 7.

The computer 7 performs data processing as described later on data obtained in the form of a digital signal from the A/D converter 11 and generates data for all views, i.e., of M views, in a k-space. The computer 7 moreover performs an image reconstruction operation on the data for all views in the k-space to produce an MR image. The MR image is displayed on a display device 6.

The computer also performs overall control, including receipt of information input from an operator console 13.

Figure 5:
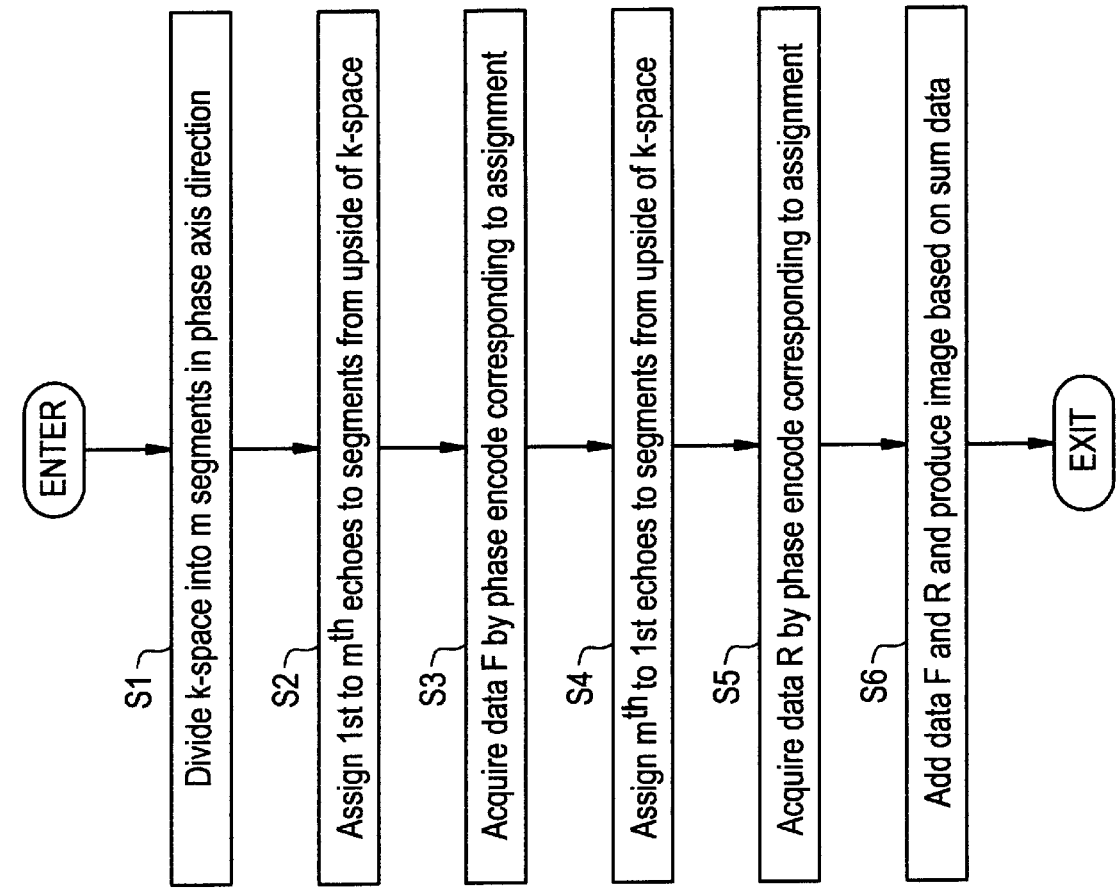
FIG. 5 is a flow chart of an MR imaging process according to the FSE method employing the sequential process executed in the MR imaging apparatus shown in FIG. 4.

FIG. 5 is a flow chart of an MR imaging process according to the FSE method employing the sequential process executed in the MR imaging apparatus 100.

Figure 6:
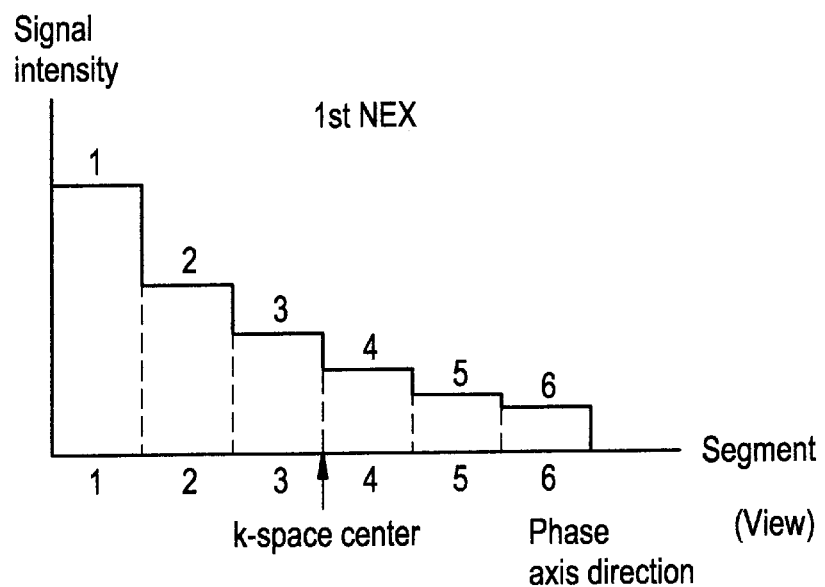
FIG. 6 illustrates the signal intensity in each segment in acquiring data F in the process shown in FIG. 5.

In Step S1, a k-space is divided into m segments in the phase axis direction, wherein m represents the number of echoes to be generated to acquire data per excitation. When m=6, for example, as shown in FIG. 6, the k-space is divided into first to sixth segments serially from the upside of the k-space (in the drawing, from left to right) in the phase axis direction. FIG. 6 also shows segment indices in the phase axis direction.

In Step S2, first to $m^{th}$ echoes are assigned to the respective segments serially from the upside of the k-space (in the drawing, from left to right). As exemplarily shown in FIG. 6, first to sixth echoes are assigned to the first to sixth segments, respectively. FIG. 6 also shows echo indices assigned to the respective segments above the signal intensity characteristic curve. As can be seen from FIG. 6, the signal intensity decrements serially from the first segment.

In Step S3, data F is acquired by phase encode corresponding to the assignment.

Figure 7:
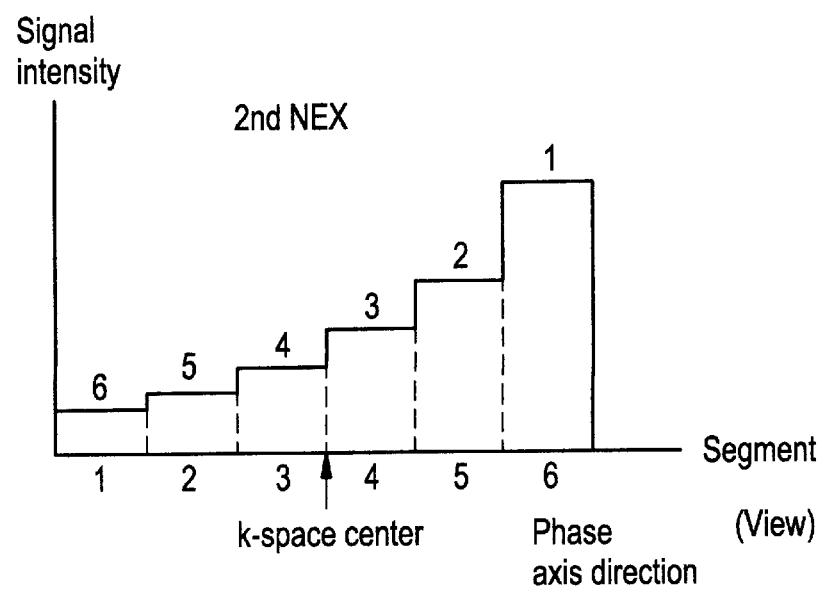
FIG. 7 illustrates the signal intensity in each segment in acquiring data R in the process shown in FIG. 5.

In Step S4, $m^{th}$ to first echoes are assigned to the respective segments serially from the upside of the k-space (in the drawing, from left to right). As exemplarily shown in FIG. 7, sixth to first echoes are assigned to the first to sixth segments, respectively. FIG. 7 also shows echo indices assigned to the respective segments above the signal intensity characteristic curve. As can be seen from FIG. 7, the signal intensity increments serially from the first segment.

In Step S5, data R is acquired by phase encode corresponding to the assignment.

In Step S6, the acquired data F and R are added and an image is produced based on the sum data.

Figure 8:
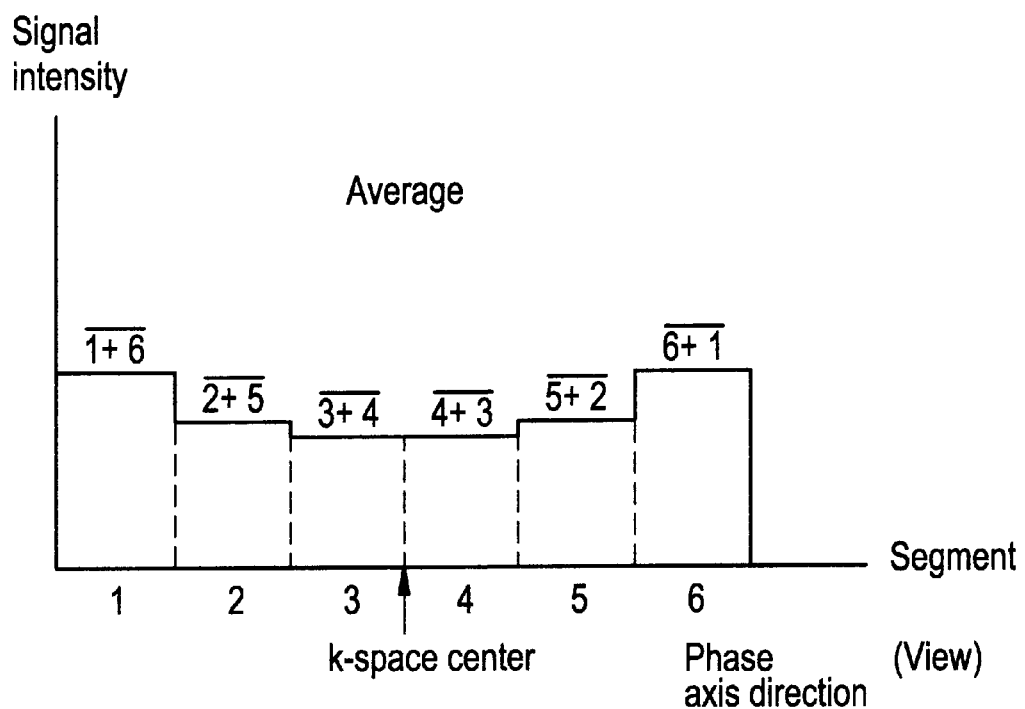
FIG. 8 illustrates the signal intensity in each segment using sum data obtained by adding the data F and R in the process shown in FIG. 5.

FIG. 8 shows the signal intensity distribution of the sum data.

As can be seen by comparing FIG. 8 with FIG. 6, the sum data shown in FIG. 8 has smaller stepwise differences in signal intensity among the segments than the data shown in FIG. 6 has. Accordingly, ghosts due to increasing echo intensity fall-off in the course of an echo train can be reduced.

Moreover, as shown in FIG. 8, since the sum data represents the sum of data of an odd-indexed echo and data of an even-indexed echo which have opposite phase error directions (signs), phase errors in an odd-indexed echo and in an even-indexed echo cancel each other, thereby reducing the phase errors. Accordingly, ghosts can be reduced also in this respect.

Figure 9:
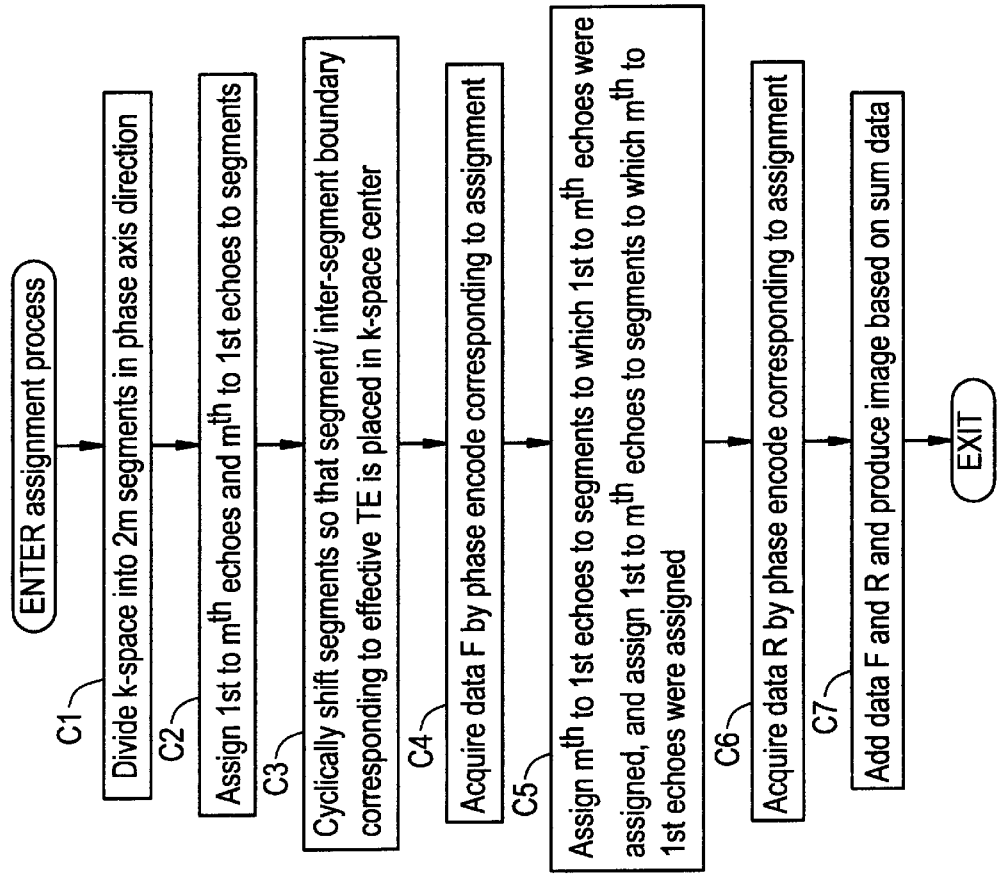
FIG. 9 is a flow chart of an MR imaging process according to the FSE method employing the centric process executed in the MR imaging apparatus shown in FIG. 4.

FIG. 9 is a flow chart of an MR imaging process according to the FSE method employing the centric process executed in the MR imaging apparatus 100.

In Step C1, a k-space is divided into 2m segments in a phase axis direction. When m=6, for example, the k-space is divided into first to twelfth segments serially from the upside of the k-space (in the drawing, from left to right) in the phase axis direction.

In Step C2, first to $m^{th}$ echoes and $m^{th}$ to first echoes are assigned to the respective segments serially from the upside of the k-space (in the drawing, from left to right).

In Step C3, the individual segments are cyclically shifted so that a segment or inter-segment boundary corresponding to an effective TE is placed in the k-space center. For example, if an inter-segment boundary between the third and fourth segments corresponds to the effective TE, the first to twelfth segments are cyclically shifted so that the boundary between the third and fourth segments is placed in the k-space center. The segment indices, assigned echo indices and signal intensities after the shift are exemplarily shown in FIG. 10.

In Step C4, data F is acquired by phase encode corresponding to the assignment.

Figure 10:
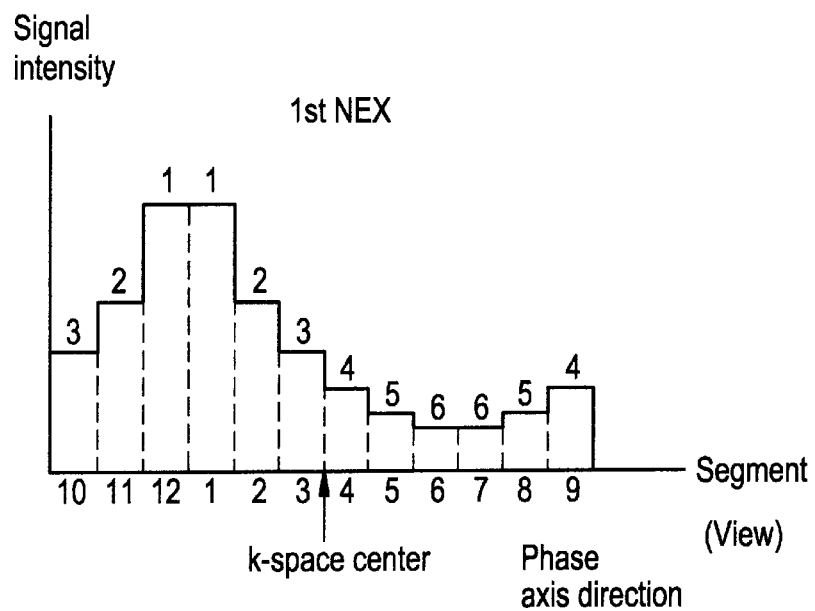
FIG. 10 illustrates the signal intensity in each segment in acquiring data F in the process shown in FIG. 9.
Figure 11:
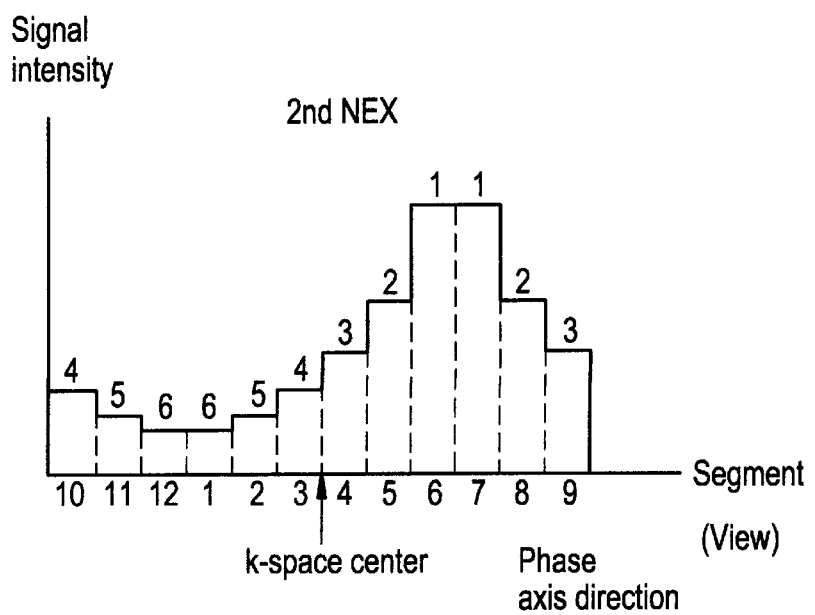
FIG. 11 illustrates the signal intensity in each segment in acquiring data R in the process shown in FIG. 9.

In Step C5, to a segment to which an $i^{th}$ (i=1, ..., m) echo was assigned in Step C4, an $(m+1-i)^{th}$ echo is assigned. For example, if the assignment was done as shown in FIG. 10, it is changed as shown in FIG. 11.

In Step C6, data R is acquired by phase encode corresponding to the assignment.

In Step C7, the acquired data F and R are added and an image is produced based on the sum data.

Figure 12:
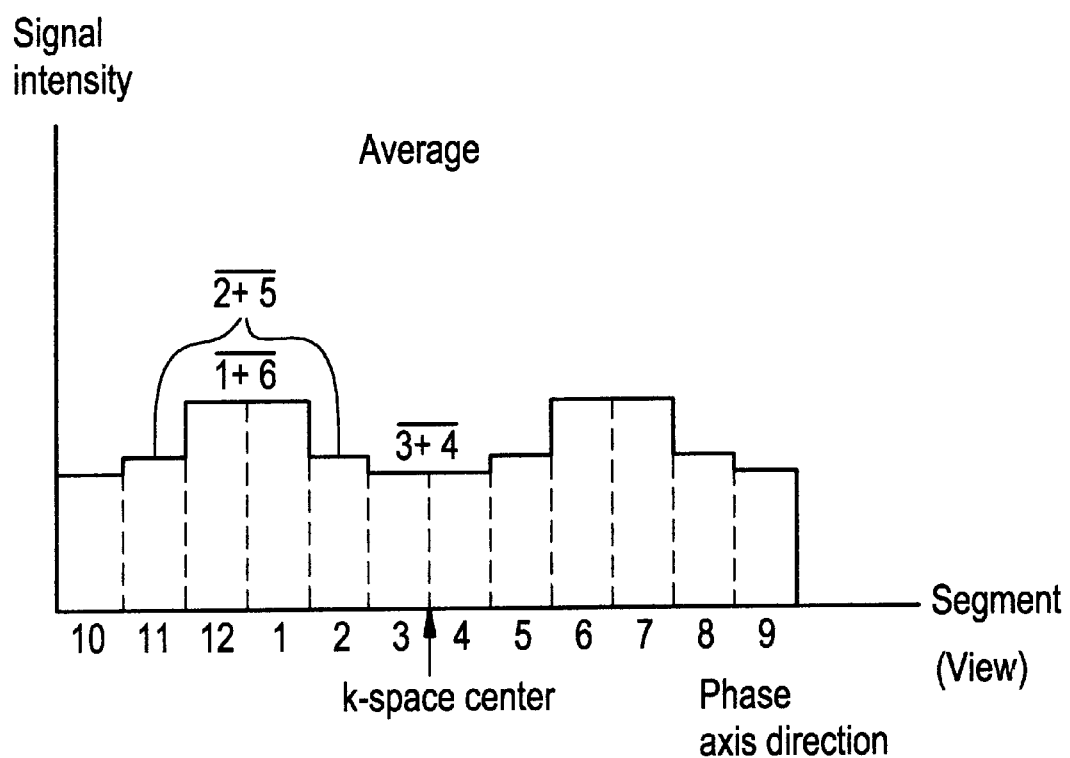
FIG. 12 illustrates the signal intensity in each segment using sum data obtained by adding the data F and R in the process shown in FIG. 9.

FIG. 12 shows the signal intensity distribution of the sum data.

As can be seen by comparing FIG. 12 with FIG. 10, the sum data shown in FIG. 12 has smaller stepwise differences in signal intensity among the segments than the data shown in FIG. 10 has. Accordingly, ghosts due to increasing echo intensity fall-off in the course of an echo train can be reduced.

Moreover, as shown in FIG. 12, since the sum data represents the sum of data of an odd-indexed echo and data of an even-indexed echo which have opposite phase error directions (signs), phase errors in an odd-indexed echo and in an even-indexed echo cancel each other, thereby reducing the phase errors. Accordingly, ghosts can be reduced also in this respect.

Figure 13:
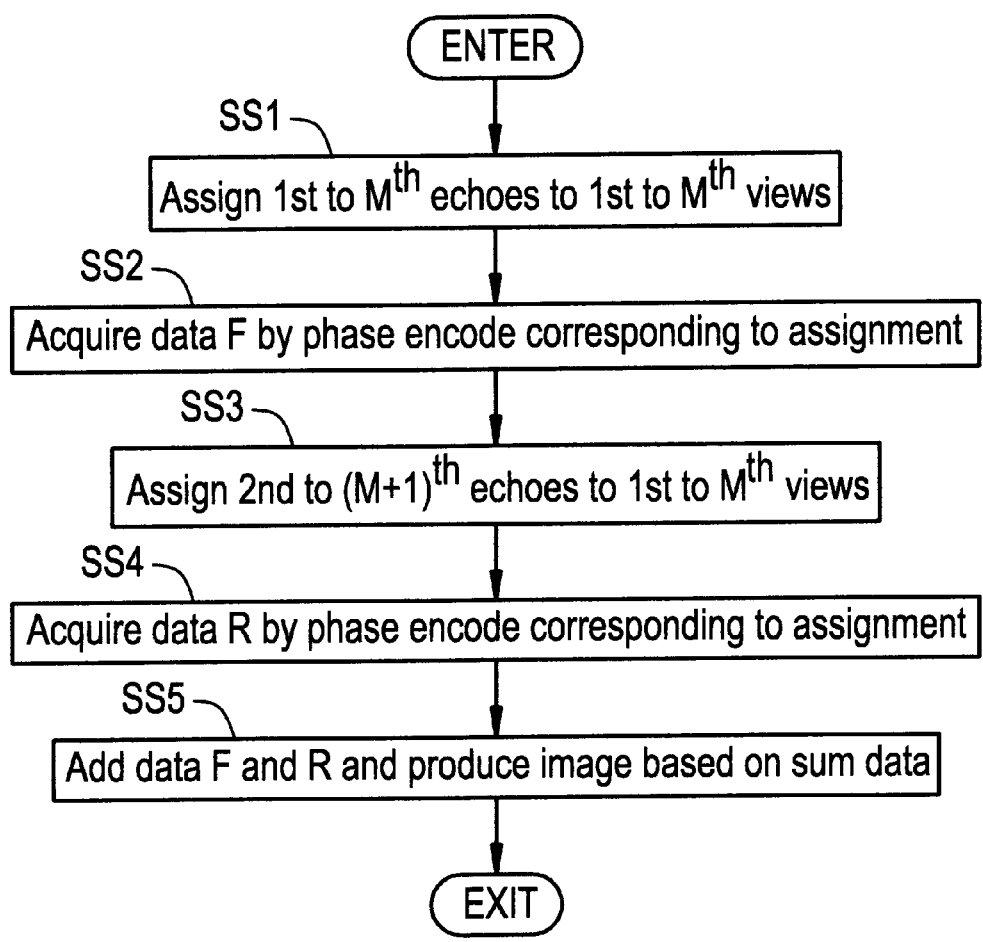
FIG. 13 is a flow chart of an MR imaging process according to the SSFSE method executed in the MR imaging apparatus shown in FIG. 4.

FIG. 13 is a flow chart of an MR imaging process according to the SSFSE method executed in the MR imaging apparatus 100.

In Step SS1, first to $M^{th}$ echoes are assigned to first to $M^{th}$ views.

Figure 14:
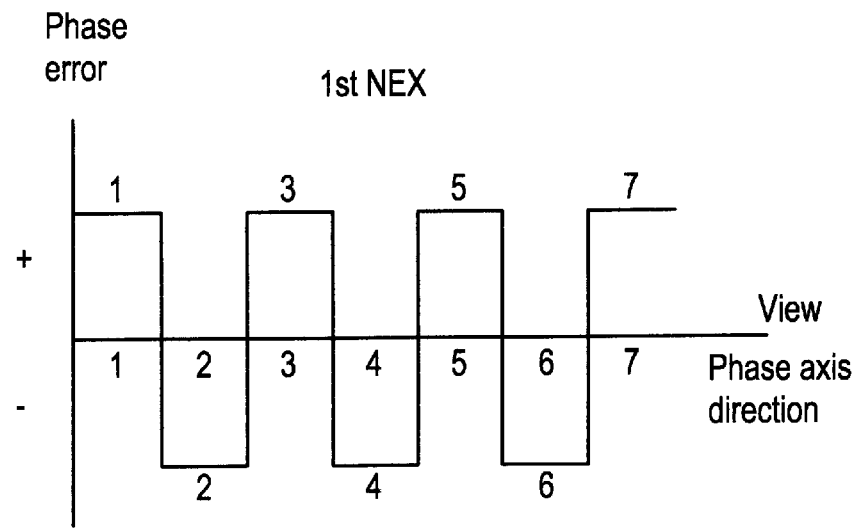
FIG. 14 illustrates the phase error in each view in acquiring data F in the process shown in FIG. 13.

In Step SS2, data F is acquired by phase encode corresponding to the assignment. FIG. 14 schematically shows the phase error for each view in this case. In FIG. 14, view indices are shown along the phase axis, and assigned echo indices are shown along the phase error characteristic curve.

In Step SS3, second to $(M+1)^{th}$ echoes are assigned to the first to $M^{th}$ views.

Figure 15:
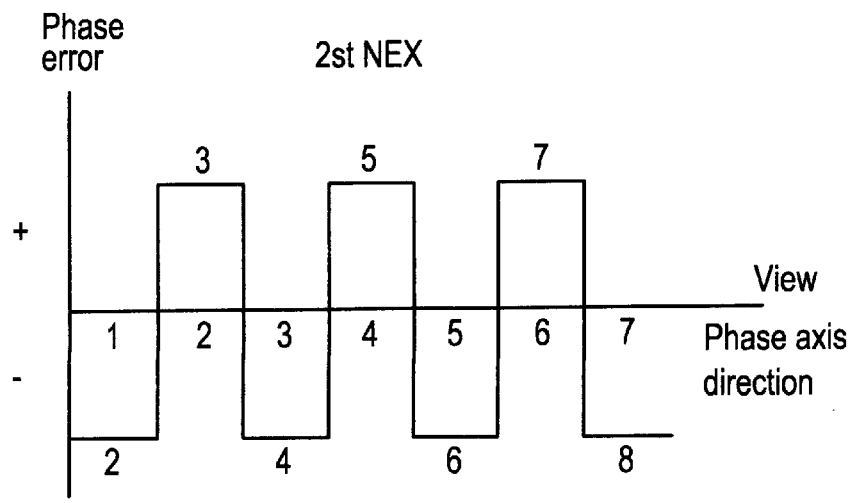
FIG. 15 illustrates the phase error in each view in acquiring data R in the process shown in FIG. 13.

In Step SS4, data R is acquired by phase encode corresponding to the assignment. FIG. 15 schematically shows the phase error for each view in this case. In FIG. 15, view indices are shown along the phase axis, and assigned echo indices are shown along the phase error characteristic curve. No data is acquired from the first echo to produce an image.

In Step SS5, the acquired data F and R are added and an image is produced based on the sum data.

Figure 16:
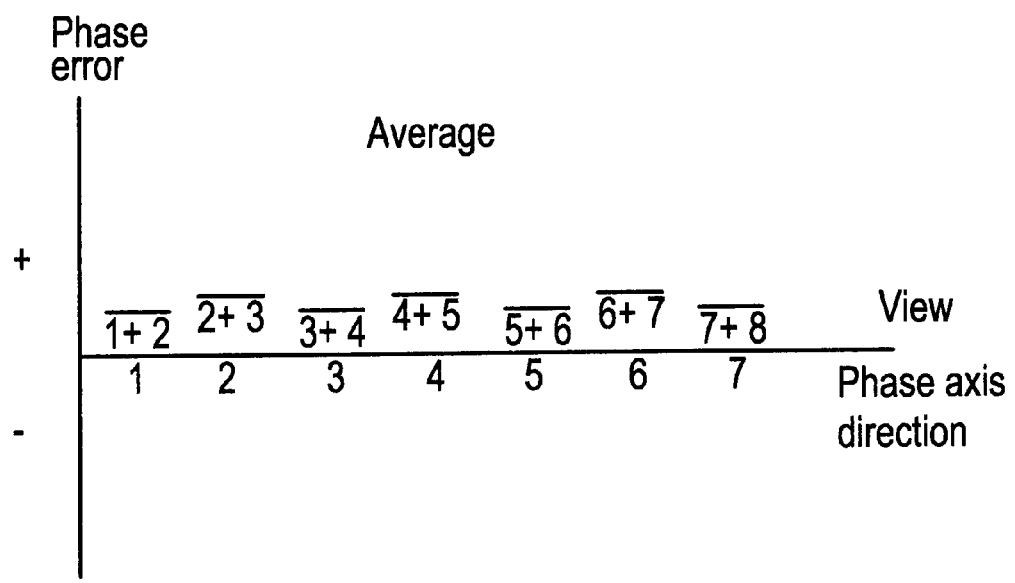
FIG. 16 illustrates the phase error in each view using sum data obtained by adding the data F and R in the process shown in FIG. 13.

FIG. 16 shows the phase error distribution of the sum data.

As can be seen by comparing FIGS. 16 and 14, the sum data shown in FIG. 16 has smaller phase errors than the data shown in FIG. 14 has. This is because phase errors in odd-indexed echoes and even-indexed echoes cancel each other. Accordingly, ghosts due to phase errors can be reduced.

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method for repeatedly generating first to $m(\geq 2)^{th}$ echoes per RF pulse and acquiring data for m views in a k-space from the echoes to acquire data for all views in the k-space, wherein the method comprises the steps of:

dividing the k-space into first to $m^{th}$ segments in a phase axis direction, assigning first to $m^{th}$ echoes serially to the first to $m^{th}$ segments, and acquiring data F while applying phase encode based on the assignment;

assigning $m^{th}$ to first echoes serially to the first to $m^{th}$ segments, and acquiring data R while applying phase encode based on the assignment; and adding the data F and R for each view, and producing an image based on the sum data.

2. An MR imaging method for repeatedly generating first to $m(\geq 2)^{th}$ echoes per RF pulse and acquiring data for m views in a k-space from the echoes to acquire data for all views in the k-space, wherein the method comprises the steps of:

dividing the k-space into first to $2m^{th}$ segments in a phase axis direction, assigning first to $m^{th}$ echoes serially to the first to $m^{th}$ segments and $m^{th}$ to first echoes serially to the $(m+1)^{th}$ to $2m^{th}$ segments, and acquiring data F while applying phase encode based on the assignment;

assigning $m^{th}$ to first echoes serially to the first to $m^{th}$ segments and first to $m^{th}$ echoes serially to the $(m+1)^{th}$ to $2m^{th}$ segments, and acquiring data R while applying phase encode based on the assignment; and adding the data F and R for each view, and producing an image based on the sum data.

3. An MR imaging method for generating multiple echoes per RF pulse and acquiring data for all views in a k-space, wherein the method comprises the steps of:

generating first to M$^{th}$ echoes per RF pulse, wherein M is the total number of views in the k-space, and acquiring data F for all views in the k-space;

generating first to (M+1)$^{th}$ echoes per RF pulse, and acquiring data R for all views in the k-space from the second to (M+1)$^{th}$ echoes thereof; and adding the data F and R for each view, and producing an image based on the sum data.

4. An MR imaging method for generating a plurality of echoes per RF pulse and acquiring data for a plurality of views in a k-space, wherein the method comprises the steps of:

assigning an odd-indexed echo to an odd-indexed view and an even-indexed echo to an even-indexed view, and acquiring data F while applying phase encode based on the assignment;

assigning an even-indexed echo to an odd-indexed view and an odd-indexed echo to an even-indexed view, and acquiring data R while applying phase encode based on the assignment; and adding the data F and R for each view, and producing an image based on the sum data.

5. An MR imaging apparatus comprising:

first assigning means for dividing a k-space into first to m$^{th}$ segments in a phase axis direction, and assigning first to m$^{th}$ echoes serially to the first to m$^{th}$ segments;

second assigning means for assigning m$^{th}$ to first echoes serially to the first to m$^{th}$ segments;

data acquisition means for repeatedly generating first to m($\geq$2)$^{th}$ echoes per RF pulse and acquiring data for m views in the k-space from the echoes to acquire data for all views in the k-space, the data acquisition means acquiring data F while applying phase encode based on the assignment by the first assigning means, and acquiring data R while applying phase encode based on the assignment by the second assigning means;

data addition means for adding the data F and R for each view; and image producing means for producing an image based on the sum data from the addition.

6. An MR imaging apparatus comprising:

first assigning means for dividing a k-space into first to 2m$^{th}$ segments in a phase axis direction, and assigning first to m$^{th}$ echoes serially to the first to m$^{th}$ segments and m$^{th}$ to first echoes serially to the (m+1)$^{th}$ to 2m$^{th}$ segments;

second assigning means for assigning m$^{th}$ to first echoes serially to the first to m$^{th}$ segments and first to m$^{th}$ echoes serially to the (m+1)$^{th}$ to 2m$^{th}$ segments;

data acquisition means for repeatedly generating first to m($\geq$2)$^{th}$ echoes per RF pulse and acquiring data for m views in the k-space from the echoes to acquire data for all views in the k-space, the data acquisition means acquiring data F while applying phase encode based on the assignment by the first assigning means, and acquiring data R while applying phase encode based on the assignment by the second assigning means;

data addition means for adding the data F and R for each view; and image producing means for producing an image based on the sum data from the addition.

7. An MR imaging apparatus comprising:

first data acquisition means for generating first to M$^{th}$ echoes per RF pulse, where M is the total number of views in a k-space, and acquiring data F for all views in the k-space;

second data acquisition means for generating first to (M+1)$^{th}$ echoes per RF pulse, and acquiring data R for all views in the k-space from the second to (M+1)$^{th}$ echoes thereof;

data addition means for adding the data F and R for each view; and image producing means for producing an image based on the sum data from the addition.

8. An MR imaging apparatus comprising:

data acquisition means for generating a plurality of echoes per RF pulse to acquire data for a plurality of views in a k-space, assigning an odd-indexed echo to an odd-indexed view and an even-indexed echo to an even-indexed view, and acquiring data F while applying phase encode based on the assignment, and assigning an even-indexed echo to an odd-indexed view and an odd-indexed echo to an even-indexed view, and acquiring data R while applying phase encode based on the assignment;

data addition means for adding the data F and R for each view; and image producing means for producing an image based on the sum data.

* * * * *